(12) United States Patent
Lee et al.

(10) Patent No.: US 7,176,538 B2
(45) Date of Patent: Feb. 13, 2007

(54) HIGH VOLTAGE MOSFET HAVING DOPED BURIED LAYER

(75) Inventors: Sun-hak Lee, Gyeonggi-do (KR); Kwang-dong Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 317 days.

(21) Appl. No.: 10/860,295

(22) Filed: Jun. 3, 2004

(65) Prior Publication Data
US 2004/0256646 A1    Dec. 23, 2004

(30) Foreign Application Priority Data
Jun. 20, 2003    (KR) .................... 10-2003-0040182

(51) Int. Cl.
*H01L 29/772* (2006.01)
(52) U.S. Cl. .................... 257/409; 257/335; 257/336; 257/339; 257/344; 257/E29.005; 438/289; 438/291
(58) Field of Classification Search ................ 257/335, 257/336, 339, 344, 409; 438/289, 291
See application file for complete search history.

(56) References Cited

U.S. PATENT DOCUMENTS

| | | | |
|---|---|---|---|
| 4,642,666 A * | 2/1987 | Lidow et al. ................ 257/339 |
| 5,023,678 A * | 6/1991 | Kinzer ........................ 257/339 |
| 5,646,054 A | 7/1997 | Rhee | |
| 5,834,352 A | 11/1998 | Choi | |
| 5,840,604 A | 11/1998 | Yoo et al. | |
| 6,159,778 A | 12/2000 | Kim | |
| 6,313,020 B1 | 11/2001 | Kim et al. | |
| 6,417,547 B2 | 7/2002 | Kang | |
| 6,521,959 B2 | 2/2003 | Kim et al. | |
| 6,541,341 B1 | 4/2003 | Son et al. | |
| 6,580,134 B1 | 6/2003 | Song et al. | |
| 6,621,116 B2 * | 9/2003 | Church ........................ 257/314 |
| 6,633,066 B1 | 10/2003 | Bae et al. | |
| 6,635,522 B2 | 10/2003 | Lee et al. | |
| 6,706,569 B2 | 3/2004 | Kim et al. | |

* cited by examiner

*Primary Examiner*—N. Drew Richards
*Assistant Examiner*—Paul Budd
(74) *Attorney, Agent, or Firm*—Myers Bigel Sibley & Sajovec PA

(57) ABSTRACT

A MOSFET includes an insulated gate electrode on a surface of a semiconductor substrate having an impurity region of first conductivity type therein that extends to the surface. Source and drain regions of second conductivity type are provided in the impurity region. The source region includes a highly doped source contract region that extends to the surface and a lightly doped source extension. The lightly doped source extension extends laterally underneath a first end of the insulated gate electrode and defines a source-side P-N junction with the well region. The drain region includes a highly doped drain contact region that extends to the surface and a lightly doped drain extension. The lightly doped drain extension extends laterally underneath a second end of the insulated gate electrode and defines a drain-side P-N junction with the well region. This well region, which extends within the impurity region and defines a non-rectifying junction therewith, is more highly doped than the impurity region. The well region extends opposite the insulated gate electrode and has a sufficient width that dopants therein partially compensate innermost portions of the lightly doped source and drain extensions that extend underneath the insulated gate electrode. However, the well region is not so wide as to provide compensation to remaining portions of the lightly doped source and drain extensions or the source and drain contact regions.

15 Claims, 9 Drawing Sheets

HIGH VOLTAGE MOSFET HAVING DOPED BURIED LAYER

RELATED APPLICATION

This application claims priority from Korean Patent Application No. 10-2003-0040182, filed on Jun. 20, 2003 in the Korean Intellectual Property Office, the content of which is incorporated herein by reference in its entirety.

FIELD OF THE INVENTION

The present invention relates to high voltage metal oxide semiconductor field effect transistors (MOSFETs) and methods of fabricating same.

BACKGROUND OF THE INVENTION

The magnitude of a maximum voltage supported by a drain or source of a MOSFET is determined by a pn junction formed along the boundary of a source or drain. Breakdown, for example, avalanche breakdown, can occur due to an increase in an electric field in a depletion region of the pn junction. The magnitude of the voltage that can be applied to a drain or source in a MOSFET at the onset of breakdown can be determined using conventional techniques. If breakdown occurs at the pn junction formed along the boundary of a source or drain, then current flowing between the drain and source may sharply increase, and this may result in damage to the pn junction and malfunction of the MOSFET.

Since a depletion region at the pn junction is inversely proportional in thickness to the square root of a doping concentration at the pn junction, it is possible to decrease the doping concentration at the pn junction and accordingly increase the thickness of the depletion region and increase the breakdown voltage of the MOSFET.

However, reducing the doping concentration of a drain or source may result in degradation of the MOSFET's electrical characteristics by, for example, increasing an ohmic contact resistance. This problem may be overcome by forming a separate region having a lower doping concentration under the drain or source and optimizing the doping concentration and the size of the separate region, to thereby adjust the breakdown voltage.

Usually in conventional methods for attaining a high voltage MOSFET, a separate underlying region having a lower doping concentration has been formed under a drain or source and the doping concentration and the size of the separate portion have been adjusted. However, the method to adjust the doping concentration of the separate underlying region has made the process for fabricating a MOSFET complicated. Further, when the doping concentration is adjusted by forming a junction in a vertical direction or increasing the junction in a horizontal direction to adjust the size of the underlying region, the process time and/or the size of a device typically increase.

SUMMARY OF THE INVENTION

Embodiments of the present invention include metal-oxide-semiconductor field effect transistors (MOSFETs) that utilize overlapping well and lightly doped source and drain regions to achieve desired withstand voltages. These embodiments include an insulated gate electrode on a surface of a semiconductor substrate having an impurity region of first conductivity type therein that extends to the surface. Source and drain regions of second conductivity type are provided in the impurity region. The source region includes a highly doped source contract region that extends to the surface and a lightly doped source (LDS) extension. The lightly doped source extension extends laterally underneath a first end of the insulated gate electrode and defines a source-side P-N junction with the well region. The drain region includes a highly doped drain contact region that extends to the surface and a lightly doped drain (LDD) extension. The lightly doped drain extension extends laterally underneath a second end of the insulated gate electrode and defines a drain-side P-N junction with the well region. This well region, which extends within the impurity region and defines a non-rectifying junction therewith, is more highly doped than the impurity region. The well region extends opposite the insulated gate electrode and has a sufficient width so that dopants therein partially compensate innermost portions of the lightly doped source and drain extensions that extend underneath the insulated gate electrode. However, the well region is not so wide as to provide compensation to remaining portions of the lightly doped source and drain extensions or the source and drain contact regions.

According to additional embodiment of the present invention, a high voltage MOSFET is provided that includes a well region formed on a semiconductor substrate. The well region is doped with impurities of a first conductivity type. First and second diffusion regions are also provided. The first and second diffusion regions are isolated from each other by the well region and doped with impurities of a second conductivity type. A gate oxide layer is formed on the well region and a gate electrode is formed on the gate oxide layer. An impurity region is formed under the well region and is doped with impurities of the first conductivity type. A third diffusion region is formed under the first diffusion region and doped with impurities of the second conductivity type. A fourth diffusion region is formed under the second diffusion region and is doped with impurities of the second conductivity type. Further embodiments of the present invention include methods of forming those MOSFETs using preferred sequences of masking, ion-implanting and diffusing of dopants into the semiconductor substrate.

BRIEF DESCRIPTION OF THE DRAWINGS

The above objects and advantages of the present invention will become more apparent by describing in detail embodiments thereof with reference to the attached drawings in which.

DETAILED DESCRIPTION OF THE INVENTION

The present invention will now be described more fully with reference to the accompanying drawings, in which exemplary embodiments of the invention are illustrated. The present invention may, however, be embodied in many different forms and should not be construed as being limited to the exemplary embodiments set forth herein. Rather, these exemplary embodiments are provided so that this disclosure will be thorough and complete, and will fully convey the scope of various embodiments of the invention to those skilled in the art. Like numbers refer to like elements throughout this description and the drawings.

Figure 1:
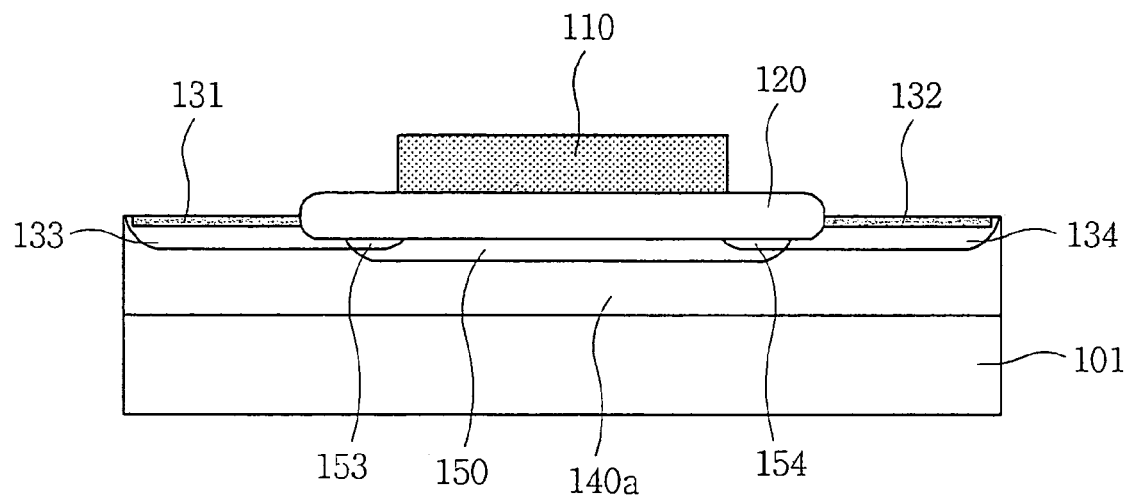
FIG. 1 is a cross-sectional view illustrating a structure of a high voltage MOSFET according to an exemplary embodiment of the present invention.

A metal-oxide-semiconductor field effect transistor (MOSFET) according to a first embodiment of the present invention will now be described with reference to FIG. 1. In FIG. 1, first and second diffusion regions 131, 132 are doped with impurities of a second conductivity type. These first and second diffusion regions 131 and 132 constitute source and drain contact regions, respectively. Third and fourth diffusion regions 133, 134 underlying the first and second diffusion regions 131, 132, respectively, are also doped with impurities of the second conductivity type. Since drain and source contacts are formed on the first and second diffusion regions 131, 132, respectively, the doping concentrations of the first and second diffusion regions 131, 132 are preferably higher than those of the third and fourth diffusion regions 133, 134, respectively, in order to reduce the source and drain contact resistance. The third and fourth diffusion regions 133 and 134 may be referred to as lightly doped source and drain regions, respectively.

A well region 150 doped with impurities of a first conductivity type overlies an impurity region 140a doped with impurities of the first conductivity type. The well region 150 is preferably doped with a concentration higher than that of the impurity region 140a so as to reduce the likelihood of parasitic conduction, which occurs when current flows in a parasitic bipolar junction transistor (BJT), and also reduce channel resistance between the first and second diffusion regions 131, 132. The parasitic bipolar transistor is defined by the well region 150, which operates as a base region, and the third or fourth diffusion regions 133 or 134, which operate as emitter and collector regions.

When the metal oxide semiconductor field effect transistor (MOSFET) of FIG. 1 is constructed in such a manner that both sides of the well region 150 overlap with the third and fourth diffusion regions 133, 134, which are doped with the impurities of the second conductivity type, then the sides of the well region 150 will partially compensate the dopants in the third and fourth diffusion regions 133, 134. The respective doping concentrations of the third and fourth diffusion regions 133, 134 and the well region 150 will also be lowered as the sizes of the overlapped regions 153, 154 increase because greater overlap means more compensation in the overlapping portions of the third and fourth diffusion regions 133, 134 and well region 150. Accordingly, it is possible to adjust the doping concentrations of the third and fourth diffusion regions 133, 134 and the well region 150 by varying the degree to which these regions overlap. In particular, as the sizes of the overlapped regions 153, 154 increase, the net doping concentrations in portions of the third and fourth diffusion regions 133, 134 and the well region 150 decrease. This decrease results in a large depletion region width across these regions and a greater breakdown voltage. However, the lower effective doping concentration can result in an increase in channel resistance, which may degrade performance. Thus, the sizes of the overlapped regions 153, 154 can be carefully adjusted to vary the breakdown voltage of the MOSFET. However, considering the above two conditions, the widths of the upper portions of the overlapped regions 153, 154 are preferably in the range of about 4.5 to about 5.5 µm, and the breakdown voltage is about 110V. As described more fully herein, the overlapped regions 153 and 154 constitute lightly doped source and drain extensions, respectively, which are partially compensated by dopants from the well region 150. The remaining portions of the lightly doped source and drain regions are not compensated by dopants from the well region 150.

The depth of the well region 150 is preferably less than that of the impurity region 140a in order to reduce the duration of the fabrication process. Preferably, the depth of the well region 150 is in the range of about 3.5 to about 4.5 µm while the depth of the impurity region 140a is in the range of about 5.5 to about 6.5 µm. If the depth of the third or fourth diffusion regions 133 or 134 is less than the depth of the impurity region 140a, then the impurity region 140a remains under the third and fourth diffusion regions 133, 134, thereby preventing vertical current leakage to the underlying semiconductor substrate 101. The depths of the third and fourth diffusion regions 133, 134 are preferably in the range of about 2.5 to about 7.5 µm, respectively.

A gate oxide layer 120 is formed over the well region 150. If necessary, the gate oxide layer 120 may extend horizontally over the overlapped regions 153 and 154. A gate electrode 110 may be formed on the gate oxide layer 120.

If the high voltage MOSFET is a PMOS transistor (i.e., P-channel MOSFET), it is preferable to use an element from Group III of the periodic table such as boron (B), (i.e., an acceptor), as the impurity of the second conductivity type, and to use an element from Group V of the periodic table, such as phosphorus (P), arsenic (As) or antimony (Sb), (i.e., a donor), as the impurity of the first conductivity type. On the other hand, if the high voltage MOSFET is an NMOS transistor (i.e., N-channel MOSFET), donor impurities are used as the impurities of the second conductivity type and acceptor impurities are used as the impurities of the first conductivity type. Moreover, in the illustrative embodiment described above, the MOSFET is preferably bilaterally symmetrical with respect to the gate electrode 110, thereby enabling bidirectional operation.

Figure 2:
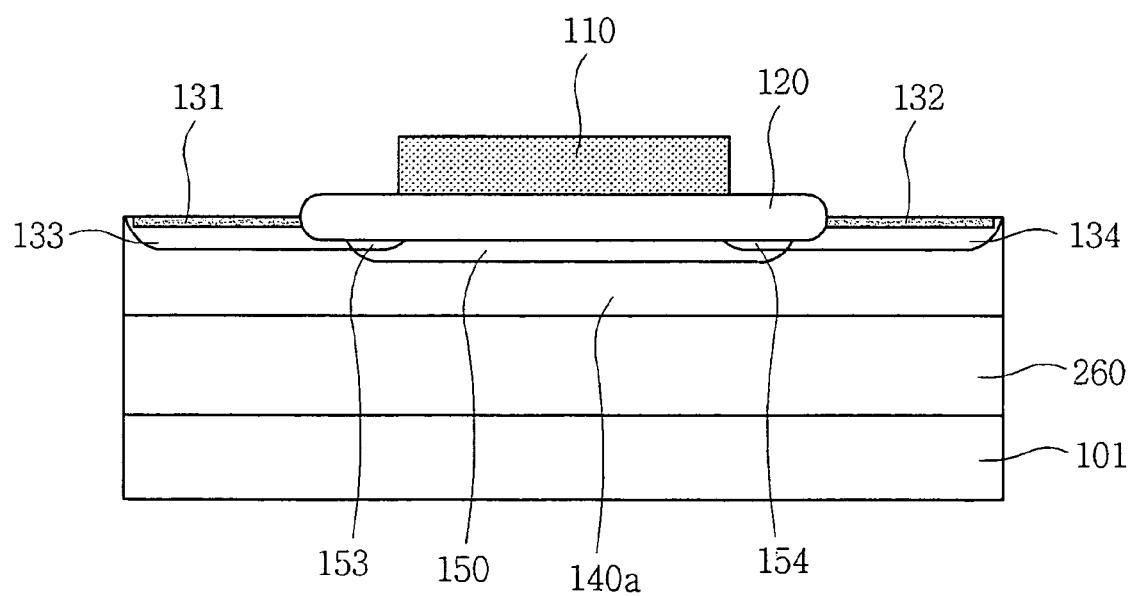
FIG. 2 is a cross-sectional view illustrating a structure of a high voltage MOSFET according to another exemplary embodiment of the present invention.

FIG. 2 is a cross-sectional view showing a structure of a high voltage MOSFET according to another embodiment of the present invention. The high voltage MOSFET of this embodiment is similar to the embodiment of FIG. 1, however, it further comprises a buried layer 260 doped with impurities of a first conductivity type. This buried layer 260 extends between the top portion of a semiconductor substrate 101 and the bottom portions of the third and fourth diffusion regions 133, 134 and the well region 150. The presence of the buried layer 260 may provide additional isolation from the semiconductor substrate 101, which underlies the buried layer 260, and also operates to inhibit latchup. To increase these benefits, the doping concentration of the buried layer 260 is preferably higher than that of the well region 150.

Figure 3A:
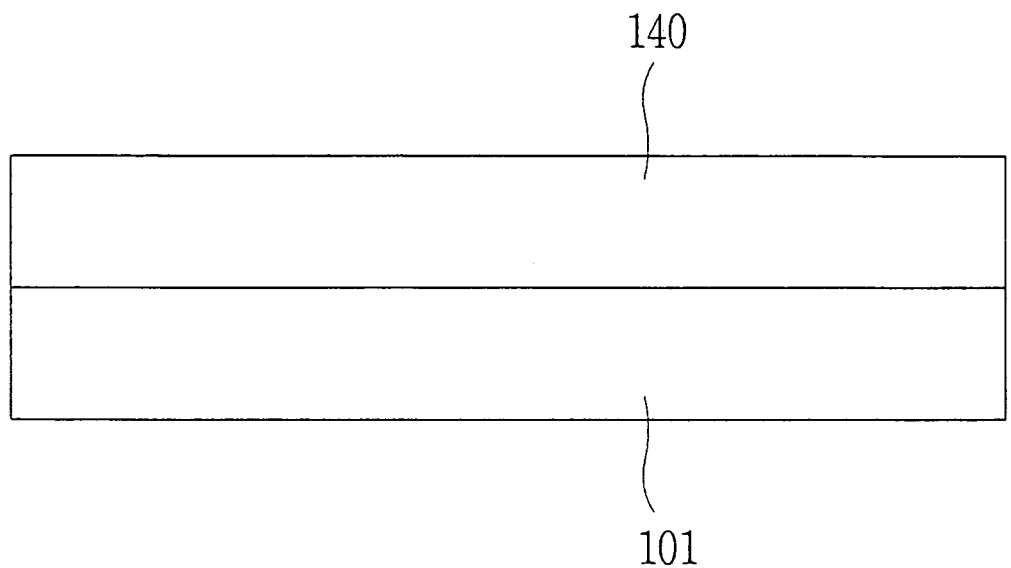
FIGS. 3A–3H are cross-sectional views illustrating a method of fabricating a high voltage MOSFET according to an exemplary embodiment of the present invention.

FIGS. 3A–3H are cross-sectional views illustrating a method of fabricating a high voltage MOSFET according to an exemplary embodiment of the present invention. First, as shown in FIG. 3A, an impurity region 140 is formed on a semiconductor substrate 101. The impurity region 140 may be formed by either epitaxially growing the impurity region 140 on the semiconductor substrate 101, or by ion-implanting first conductivity type dopants into the semiconductor substrate 101 and then annealing the substrate 101 to drive-in the implanted dopants. Of these two region forming methods, the epitaxial grow method is more preferable because it typically reduces the likelihood of latch-up in a resulting MOSFET.

Figure 3B:
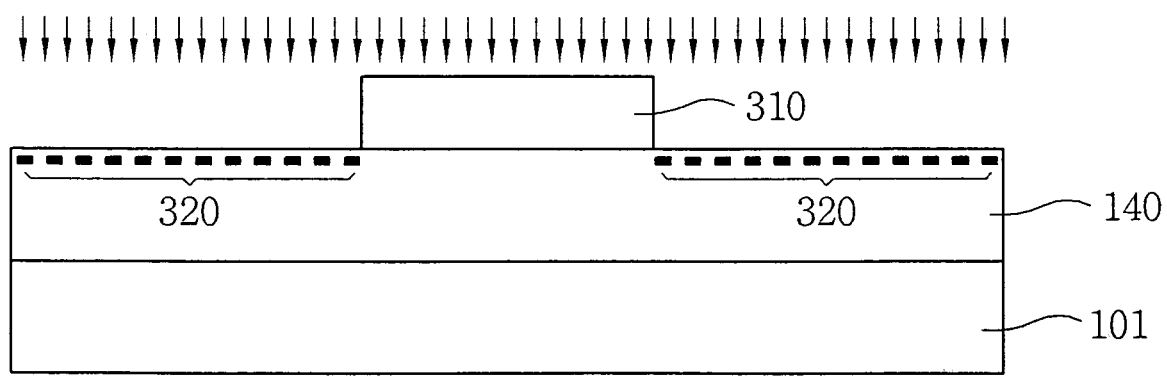

Second, as shown in FIG. 3B, a photo resist layer is deposited and then patterned to leave a photo-resist mask 310 on a portion of the impurity region 140 (excluding regions where the first and second diffusion regions 131, 132 are to be formed). Then, impurities of the second conductivity type are ion-implanted into unmasked portions of the impurity region 140. The photo resist mask 310 is then removed. The impurities of the second conductivity type are then introduced into regions where the third and fourth diffusion regions 133, 134 will be formed, to form a first ion-implantation region 320 having a predetermined depth. The ion-implantation of the impurities of the second conductivity type in the second step is performed in order to form the third and fourth diffusion regions 133, 134. As described above, if the net doping concentration in these regions decreases, the breakdown voltage of the resulting MOSFET will typically increase. However, this decrease in net doping concentration typically increases channel resistance and can degrade the electrical characteristics of the resulting MOSFET. To prevent this it is preferable that the dose of the impurities of the second conductivity type is in the range of about $2\times10^{12}$ to about $5\times10^{13}$ atoms/cm$^2$.

Figure 3C:
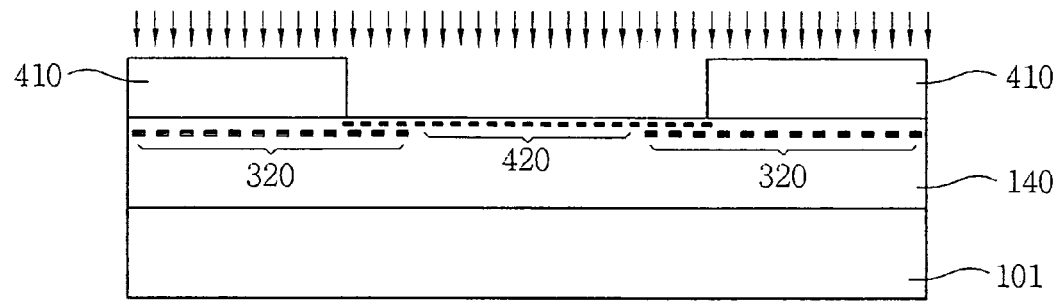

Referring to FIG. 3C, in a third step, another photo resist layer is patterned to leave a photo resist mask 410 on portions of the first ion-implantation region 320 excluding regions where the well region 150 will overlap with the third and fourth diffusion regions 133, 134, respectively. Then, the impurities of the first conductivity type are ion-implanted through the opening in the photo resist mask 410 to define a second implant region 420. Then, the photo resist mask 410 is removed using a cleaning step. Since the impurities are diffused during a subsequent heat treatment to form the regions where the well region 150 will overlap with the third and fourth diffusion regions 133, 134, respectively, it is preferable to implant the impurities into a smaller region than the region that will eventually be formed by diffusion. It is preferable that the impurities implanted through the photo resist mask 410 should be implanted at a dose in the range of about $1\times10^{12}$ to about $5\times10^{13}$ atoms/cm$^2$.

Figure 3D:
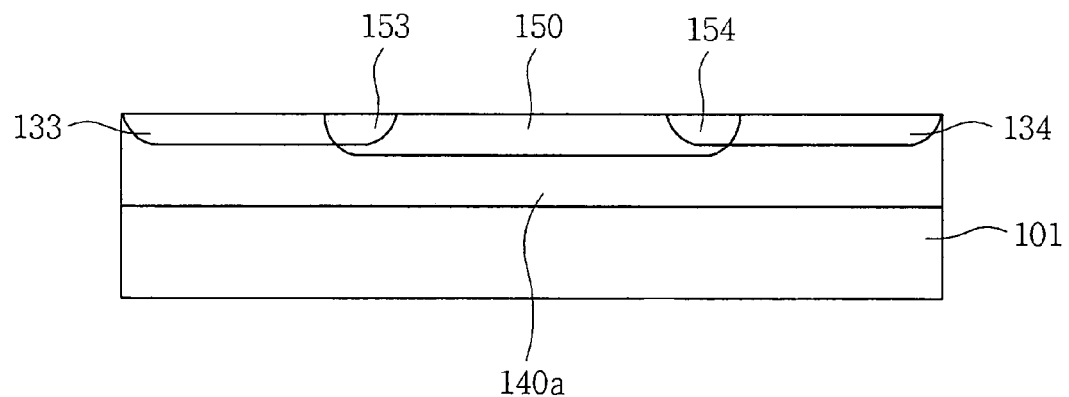

As shown in FIG. 3D, a heat treatment step is performed on the semiconductor substrate 101 into which the impurities of the first conductivity type have been sequentially ion-implanted. As a result of the heat treatment, the ion-implanted impurities of the first and second conductivity types are diffused downward to form the third and fourth diffusion regions 133, 134, the well region 150, the impurity region 140a, and the regions 153, 154 where the well region 150 overlaps with the third and fourth diffusion regions 133, 134, respectively. The heat treatment may be carried out at a temperature in the range of about 1000 to about 1200° C. and for 1–10 hours. The overlap regions 153 and 154 have a net second conductivity type, even after partial compensation by the well region dopants.

Figure 3E:
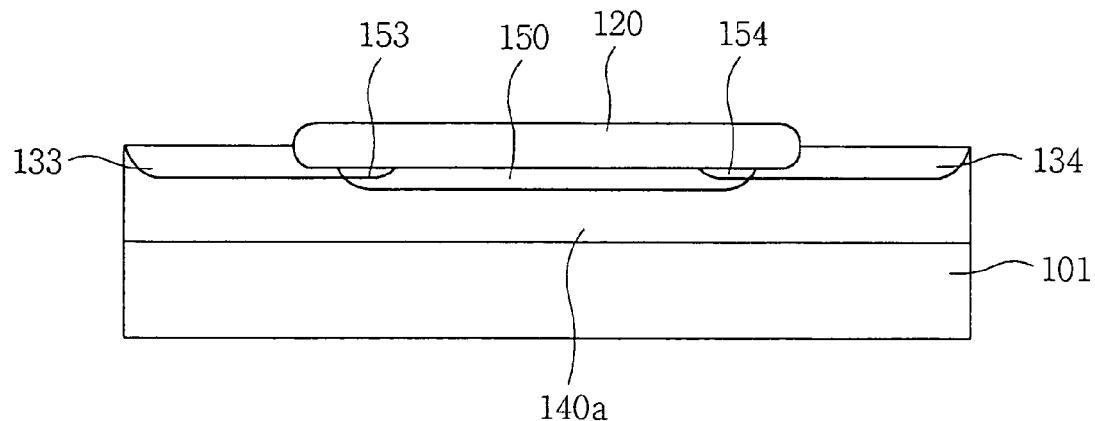
Figure 3F:
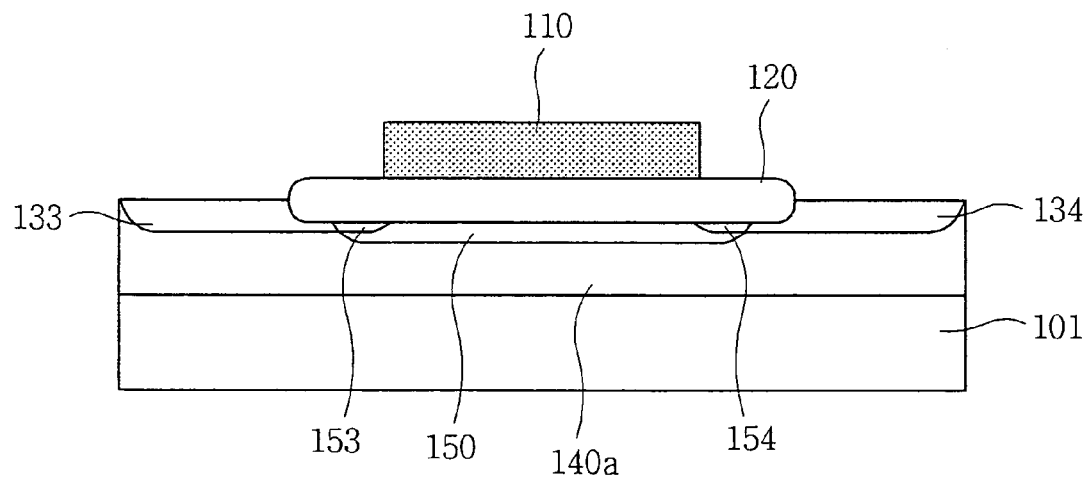

Referring to FIG. 3E, the gate oxide layer 120 is formed on the well region 150. The gate oxide layer 120 may be formed by a high temperature oxidation step in an oxidizing atmosphere or by chemical vapor deposition (CVD) step in which oxygen gas reacts with a gas containing silicon. The gate oxide layer 120, which is an important factor in determining the threshold voltage of the MOSFET, may be formed to a thickness in a range between about 100 to about 8,000 Å. Next, as shown in FIG. 3F, polysilicon layer is deposited over the gate oxide layer 120 and the gate electrode 110 is formed using a photo resist patterning step.

Figure 3G:
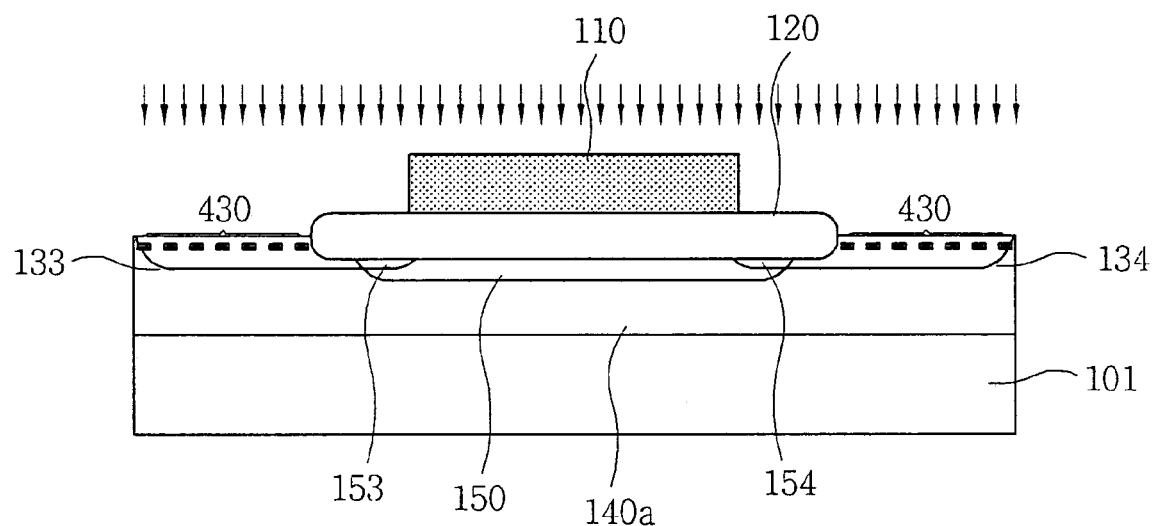

Referring to FIG. 3G, the impurities of a second conductivity type are ion-implanted into the entire surface of the substrate 101. In this case, since the gate electrode 110 and the gate oxide layer 120 act as a mask, ion-implantation is selectively performed over the entire surface excluding the gate electrode 110 and the gate oxide layer region 120. The impurities of the second conductivity type are then introduced into the regions where the first and second diffusion regions 131, 132 will be formed, to thereby form a third ion-implantation region 430 having a predetermined depth. In order to provide an effective ohmic contact, this dose of the impurities of the second conductivity type is preferably in the range of about $5\times10^{14}$ to about $5\times10^{15}$ atoms/cm$^2$.

Figure 3H:
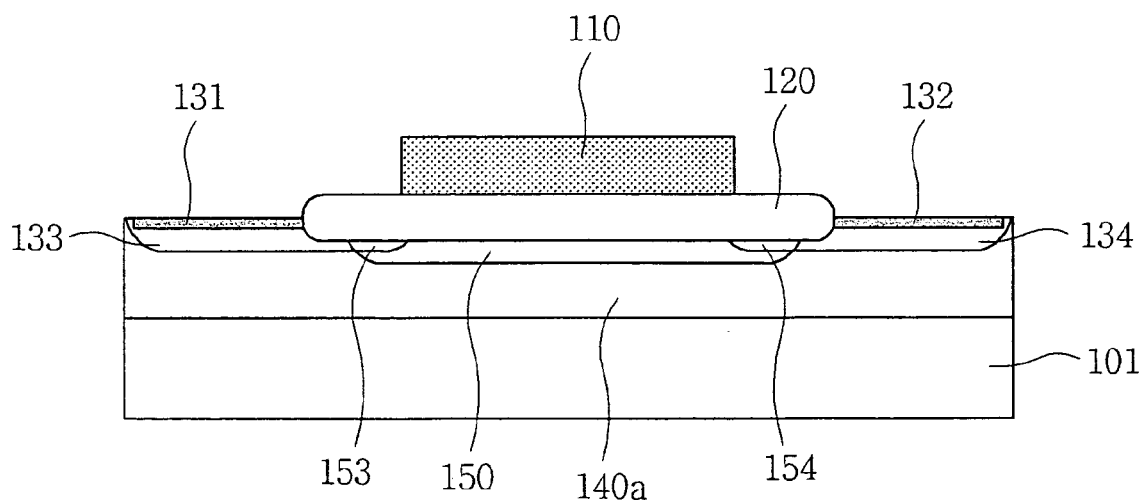
Figure 4A:
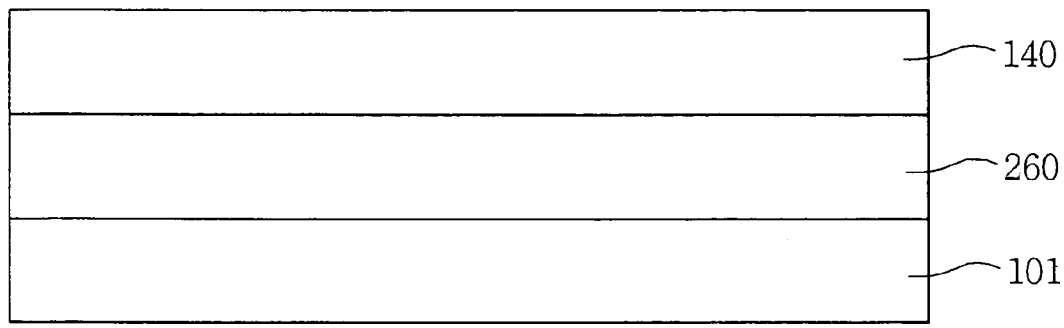
FIGS. 4A–4H are cross-sectional views illustrating a method of fabricating a high voltage MOSFET according to another exemplary embodiment of the present invention.
Figure 4B:
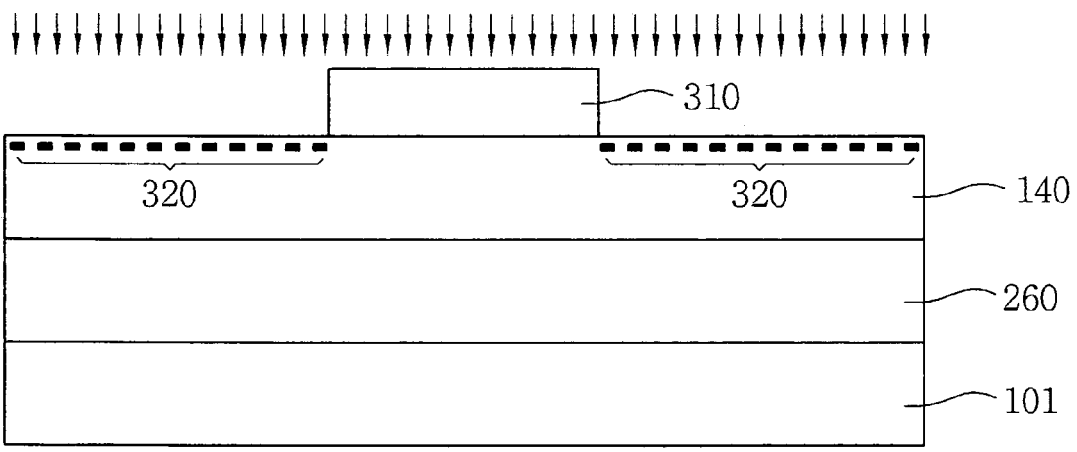
Figure 4C:
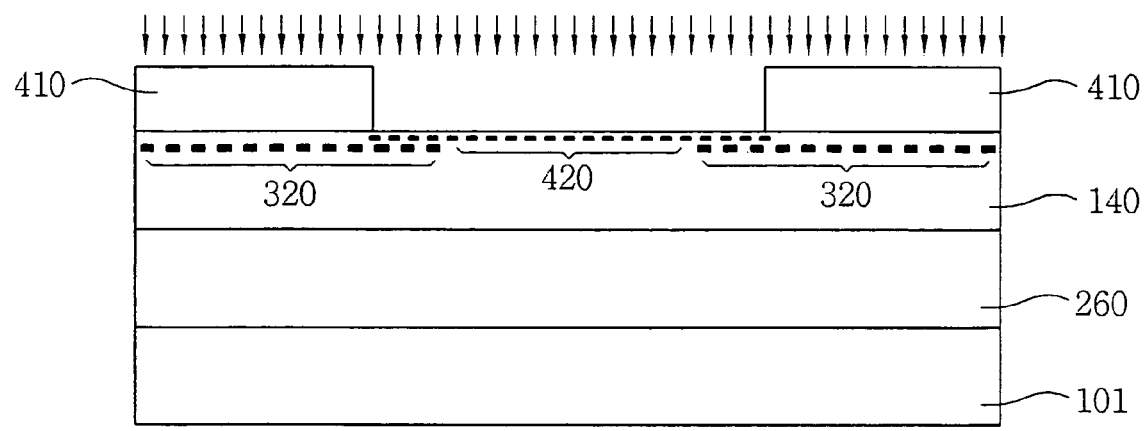
Figure 4D:
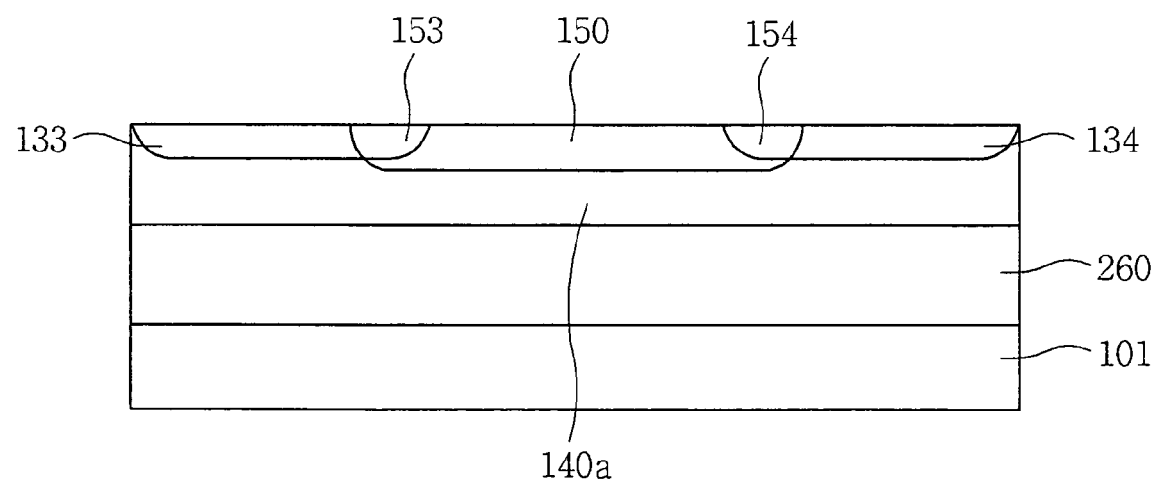
Figure 4E:
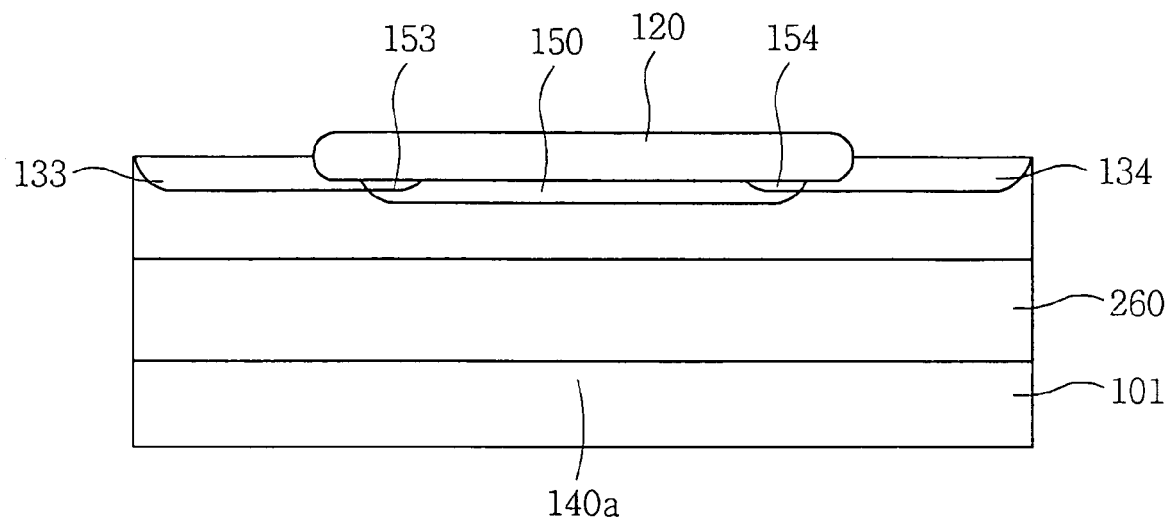
Figure 4F:
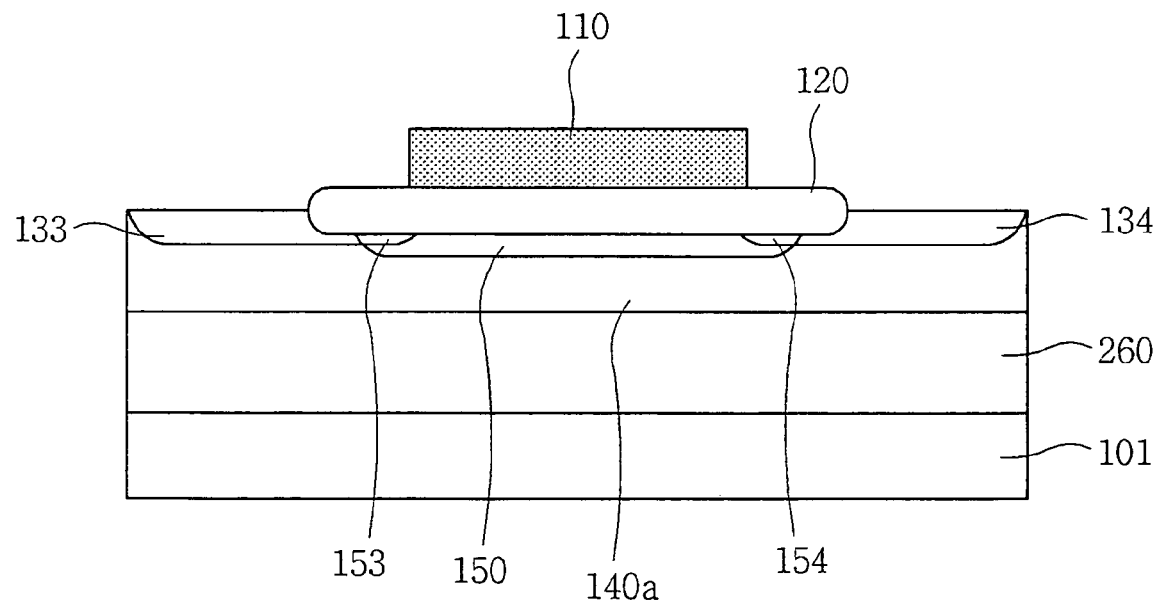
Figure 4G:
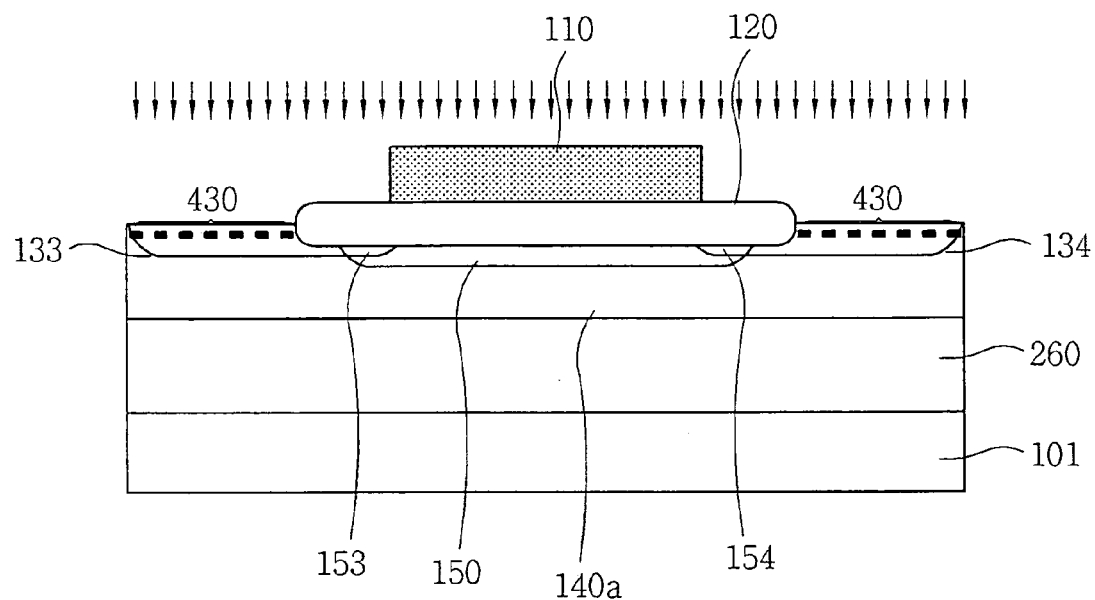
Figure 4H:
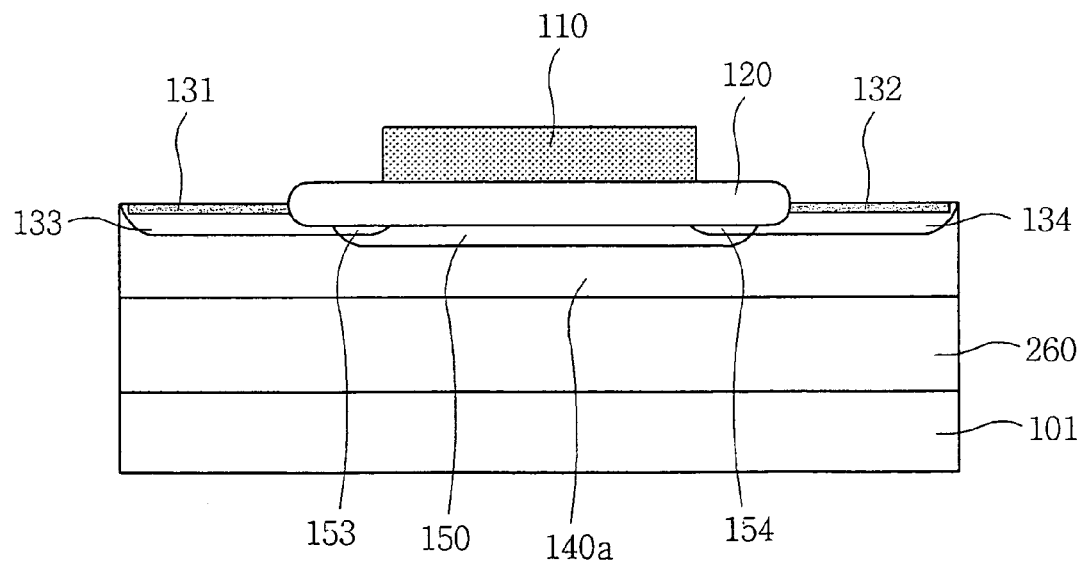

As shown in FIG. 3H, a heat treatment step is performed in order to form the first and second diffusion regions 131, 132 by diffusion. As a result of heat treatment, the ion-implanted impurities of the second conductivity type are diffused downward to form the first and second diffusion regions 131, 132, which operate as source and drain contact regions.

FIGS. 4A–4H are cross-sectional views illustrating a method of fabricating a high voltage MOSFET according to another exemplary embodiment of the present invention. The same elements as those in FIGS. 3A–3H are denoted by the same reference numerals and a detailed explanation thereof will not be given. The difference in this embodiment is that the fabricating method further includes forming the buried layer 260 by ion-implanting the impurities of the first conductivity type and diffusing the same before epitaxially growing the impurity region 140. As described above, in order to provide isolation from the semiconductor substrate 101 underlying the buried layer 260 and to better prevent a latchup phenomenon, the dose of the impurities of the first conductivity type is preferably in the range of about $1\times10^{14}$ to about $5\times10^{16}$ atoms/cm$^2$.

While the present invention has been particularly shown and described with respect to illustrative embodiments thereof, it will be understood by those skilled in the art that the foregoing and other changes in form and details may be made therein without departing from the spirit and scope of the invention which should be limited only by the scope of the appended claims. Thus, preferred embodiments of the invention disclosed above are used in a generic and descriptive sense only and not for purposes of limitation.

What is claimed is:

1. A high voltage metal oxide semiconductor field effect transistor (MOSFET), comprising:
    a well region formed on a semiconductor substrate and doped with impurities of a first conductivity type;
    first and second diffusion regions isolated from each other by the well region and doped with impurities of a second conductivity type;
    a gate oxide layer formed on the well region;
    a gate electrode formed on the gate oxide layer;
    an impurity region formed under the well region and doped with impurities of the first conductivity type;
    a third diffusion region formed under the first diffusion region and doped with impurities of the second conductivity type; and
    a fourth diffusion region formed under the second diffusion region and doped with impurities of the second conductivity type;
    a buried layer doped with impurities of the first conductivity type under the third diffusion region, the well region, and the fourth diffusion region; and
    wherein the sides of the well region overlap with the third and fourth diffusion regions, respectively.

2. The high voltage MOSFET of claim 1, wherein the lengths of upper portions of regions where the well region overlaps with the third and fourth diffusion regions are in the range of about 4.5 to about 5.5 μm, respectively.

3. The high voltage MOSFET of claim 2, wherein the depth of the well region is smaller than that of the impurity region.

4. The high voltage MOSFET of claim 2, wherein the depth of the third or fourth diffusion region is less than the sum of the depths of the well region and the impurity region.

5. The high voltage MOSFET of claim 2, wherein the depth of the well region is in the range of about 3.5 to about 4.5 μm, the depth of the impurity region is in the range of about 5.5 to about 6.5 μm, and the depth of the third or fourth diffusion region is in the range of about 2.5 to about 7.5 μm.

6. The high voltage MOSFET of claim 5, wherein the doping concentration of the first diffusion region is higher than that of the third diffusion region and the doping concentration of the second diffusion region is higher than that of the fourth diffusion region.

7. The high voltage MOSFET of claim 5, wherein the doping concentration of the well region is higher than that of the impurity region.

8. The high voltage MOSFET of claim 5, wherein the impurities of the first conductivity type act as acceptors and the impurities of the second conductivity type act as donors.

9. The high voltage MOSFET of claim 5, wherein the impurities of the first conductivity type act as donors while the impurities of the second conductivity type act as acceptors.

10. The high voltage MOSFET of claim 5, wherein the high voltage MOSFET is bilaterally symmetrical with respect to the gate electrode.

11. The high voltage MOSFET of claim 1, wherein the doping concentration of the buried layer is higher than that of the well region.

12. A field effect transistor, comprising:
an insulated gate electrode on a surface of a semiconductor substrate having an impurity region of first conductivity type therein that extends to the surface;
a source region of second conductivity type in the impurity region, said source region comprising a lightly doped source extension that extends laterally underneath a first end of said insulated gate electrode and defines a source-side P-N junction with the impurity region;
a drain region of second conductivity type in the impurity region, said drain region comprising a lightly doped drain extension that extends underneath a second end of said insulated gate electrode and defines a drain-side P-N junction with the impurity region;
a well region of first conductivity type that extends in and is more highly doped than the impurity region, said well region extending opposite said insulated gate electrode and having a sufficient width so that dopants therein partially compensate innermost portions of the lightly doped source and drain extensions that extend underneath said insulated gate electrode yet provide no compensation to remaining portions of the lightly doped source and drain extension; and
a buried layer doped with impurities of the first conductivity type extending under said source, well and drain regions.

13. The high voltage MOSFET of claim 12, wherein a first conductivity type doping concentration of said buried layer is higher than that of said well region.

14. A high voltage metal oxide semiconductor field effect transistor (MOSFET), comprising:
a well region formed on a semiconductor substrate and doped with impurities of a first conductivity type;
first and second diffusion regions isolated from each other by the well region and doped with impurities of a second conductivity type;
a gate oxide layer formed on the well region;
a gate electrode formed on the gate oxide layer;
an impurity region formed under the well region and doped with impurities of the first conductivity type;
a third diffusion region formed under the first diffusion region and doped with impurities of the second conductivity type; and
a fourth diffusion region formed under the second diffusion region and doped with impurities of the second conductivity type; and
a buried layer doped with impurities of the first conductivity type under the third diffusion region, the well region, and the fourth diffusion region;
wherein the sides of the well region overlap with the third and fourth diffusion regions, respectively;
wherein the lengths of upper portions of regions where the well region overlaps with the third and fourth diffusion regions are in the range of about 4.5 to about 5.5 μm, respectively; and
wherein the depth of the well region is in the range of about 3.5 to about 4.5 μm, the depth of the impurity region is in the range of about 5.5 to about 6.5 μm, and the depth of the third or fourth diffusion region is in the range of about 2.5 to about 7.5 μm.

15. The high voltage MOSFET of claim 14, wherein the doping concentration of the buried layer is higher than that of the well region.

* * * * *